(12) United States Patent
Lee et al.

(10) Patent No.: US 10,930,796 B2
(45) Date of Patent: *Feb. 23, 2021

(54) MERGED P-INTRINSIC-N (PIN) SCHOTTKY DIODE

(71) Applicant: SEMICONDUCTOR COMPONENTS INDUSTRIES, LLC, Phoenix, AZ (US)

(72) Inventors: Wonhwa Lee, Bucheon-si (KR); Kwangwon Lee, Incheon (KR); Jaegil Lee, Incheon (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/406,228

(22) Filed: May 8, 2019

(65) Prior Publication Data
US 2019/0267496 A1 Aug. 29, 2019

Related U.S. Application Data

(63) Continuation of application No. 15/697,276, filed on Sep. 6, 2017, now Pat. No. 10,333,005.

(51) Int. Cl.
*H01L 29/868* (2006.01)
*H01L 29/06* (2006.01)
(Continued)

(52) U.S. Cl.
CPC ........ *H01L 29/868* (2013.01); *H01L 29/0619* (2013.01); *H01L 29/08* (2013.01); *H01L 29/417* (2013.01); *H01L 29/66143* (2013.01); *H01L 29/872* (2013.01); *H01L 29/0634* (2013.01); *H01L 29/0657* (2013.01)

(58) Field of Classification Search
CPC ..... H01L 29/868; H01L 29/417; H01L 29/08; H01L 29/66143; H01L 29/872; H01L 29/0634; H01L 29/0657

See application file for complete search history.

(56) References Cited

U.S. PATENT DOCUMENTS

6,184,545 B1 * 2/2001 Werner ............... H01L 29/0634
257/109
6,351,018 B1 2/2002 Sapp
(Continued)

*Primary Examiner* — Su C Kim
(74) *Attorney, Agent, or Firm* — Brake Hughes Bellermann LLP (57) ABSTRACT

In a general aspect, a method can include forming a first pillar of a first conductivity type and a second pillar of a second conductivity type, alternately disposed with the first pillar. The second pillar can be in direct contact with the first pillar. The method can also include forming an implant of the second conductivity type in an upper portion of the second pillar. The implant can have a doping concentration that is higher than a doping concentration of a lower portion of the second pillar. The method can further include forming a Schottky metal layer having a first portion directly disposed on an upper surface of the first pillar and a second portion directly disposed on the implant along an upper surface of the second pillar. The first portion of the Schottky metal layer can be wider than the second portion of the Schottky metal layer.

17 Claims, 8 Drawing Sheets

(51) Int. Cl.
  *H01L 29/417*  (2006.01)
  *H01L 29/08*  (2006.01)
  *H01L 29/66*  (2006.01)
  *H01L 29/872*  (2006.01)

(56) References Cited

U.S. PATENT DOCUMENTS

| | | |
|---|---|---|
| 6,815,766 B2 | 11/2004 | Miyasaka et al. |
| 6,987,305 B2 | 1/2006 | He et al. |
| 8,829,624 B2 | 9/2014 | Gladish et al. |
| 9,577,046 B1 | 2/2017 | Hori et al. |
| 2006/0071276 A1 | 4/2006 | Zundel et al. |
| 2006/0275993 A1 | 12/2006 | Fong |
| 2007/0075392 A1* | 4/2007 | Pan ................... H01L 29/782 257/483 |
| 2007/0274014 A1 | 11/2007 | Berberich et al. |
| 2008/0135929 A1 | 6/2008 | Saito et al. |
| 2014/0264477 A1 | 9/2014 | Bhalla et al. |
| 2016/0181442 A1 | 6/2016 | Higashida |

* cited by examiner

MERGED P-INTRINSIC-N (PIN) SCHOTTKY DIODE

RELATED APPLICATION

This application is a continuation of, and claims priority to, U.S. patent application Ser. No. 15/697,276, filed Sep. 6, 2017, titled "MERGED P-INTRINSIC-N (PIN) SCHOTTKY DIODE," the disclosure of which is incorporated herein by reference in its entirety.

TECHNICAL FIELD

This description relates to Schottky devices. More particularly, the description relates to merged P-intrinsic-N (PiN) Schottky diodes implemented in a superjunction charge balance structure.

BACKGROUND

Known Schottky devices can have undesirable performance characteristics. Thus, a need exists for systems, methods, and apparatus to address the shortfalls of present technology and to provide other new and innovative features.

SUMMARY

In a general aspect, a device can include a substrate, a first pillar of a first conductivity type, a second pillar of a second conductivity type, the first pillar and the second pillar being alternately disposed, and a metal layer having a first portion disposed on the first pillar and a second portion disposed on the second pillar. The first portion of the metal layer can be wider than the second portion of the metal layer.

In another general aspect, a device can include a semiconductor substrate of a first conductivity type. The semiconductor substrate can include a semiconductor region of the first conductivity type. The device can also include a trench disposed in the semiconductor region. The trench can define a mesa of the semiconductor region on a side of the trench. The device can further include a semiconductor material of a second conductivity type disposed in and recessed in the trench to define a recess. The recess can have a sidewall and a bottom surface. The device can also include an implant of the second conductivity type disposed in an upper portion of the semiconductor material along the bottom surface of the recess and along at least a lower portion of the sidewall of the recess. The implant can have a doping concentration that is higher than a doping concentration of the semiconductor material of the second conductivity type. The device can further include a metal layer disposed on an upper surface of the mesa, on the sidewall of the recess, and on the bottom surface of the recess.

In yet another general aspect, a device can include a semiconductor region of a first conductivity type and a trench disposed in the semiconductor region. The trench can define a mesa of the semiconductor region on a side of the trench. The device can also include a semiconductor material of a second conductivity type disposed in the trench and a recess disposed above the semiconductor material in the trench. The recess can have a sidewall and a bottom surface, where the sidewall can be defined by the mesa. The device can further include an implant of the second conductivity type disposed between the bottom surface of the recess and above a top surface of the semiconductor material of the second conductivity type. The implant can have a doping concentration that is higher than a doping concentration of the semiconductor material. The device can still further include a Schottky metal layer disposed on an upper surface of the mesa, on the sidewall of the recess, and on the bottom surface of the recess.

DETAILED DESCRIPTION

Figure 1:
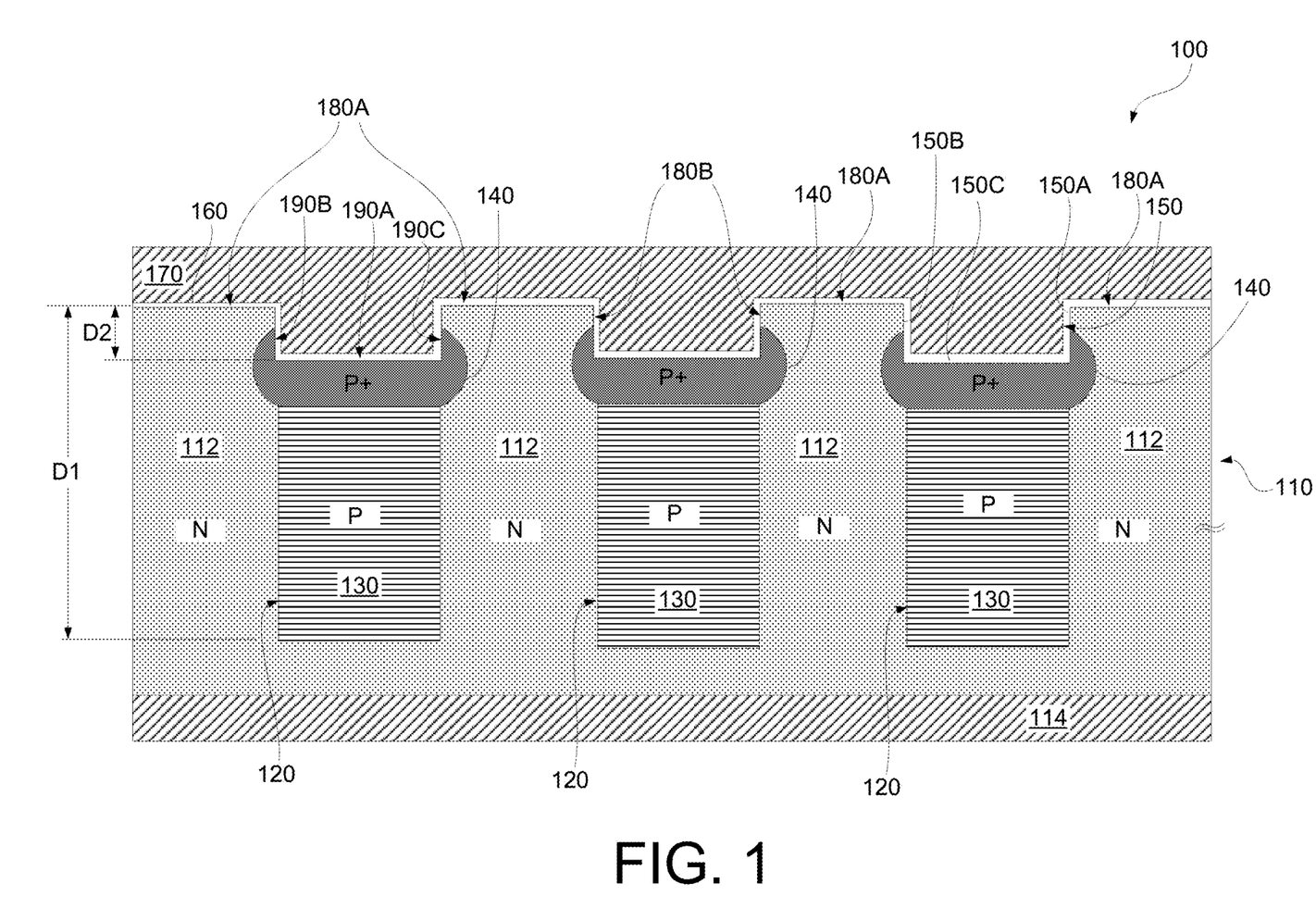
FIG. 1 is a diagram that illustrates a side cross-sectional view of Schottky device including a merged PiN Schottky diode.

FIG. 1 is a diagram that illustrates a side cross-sectional view of a Schottky device 100 that includes a merged P-intrinsic-N (PiN) Schottky diode (which can be referred to as including a Schottky contact(s) or Schottky interface(s)). The Schottky device 100 of FIG. 1 includes Schottky interfaces 180A and 180B that are formed in a charge-balance structure (e.g., a superjunction charge-balance structure) that includes pillars of alternating (N and P) conductivity type, where the alternating pillars are formed in a semiconductor region 110 using, for example, the approaches described herein. The Schottky device 100 also includes a P-type (P+) implant 140 that increases a P+ contact area of the Schottky device 100, where the implant 140 is disposed in an upper portion of a recessed P-type pillar, and is also disposed in an adjacent portion of an N-type pillar (e.g., along lower portions of sidewalls of a recess above the P-type pillar), as is described in further detail below.

The implant 140, in combination with a recess 150 that is disposed above the P-type pillar, provides a P+ contact area in the Schottky device 100. This P+ contact reduces a forward voltage drop ($V_f$) of merged PiN Schottky diode of the Schottky device 100 as compared to prior Schottky device implementations included in superjunction charge-balance structures.

In some implementations, while not specifically shown in FIG. 1, the semiconductor region 110 can be included in a substrate (e.g., a semiconductor substrate) having multiple layers with different doping concentrations. For instance, such a semiconductor substrate can include a first semiconductor layer that is heavily doped and a second semiconductor layer disposed on the first semiconductor layer, where the second semiconductor layer is lightly doped relative to the first semiconductor layer. The second semiconductor layer can be, for example a doped epitaxial layer that is grown on the first semiconductor layer. For example, the first semiconductor layer can be an N+ doped layer, while the second semiconductor layer is an N doped layer. As shown in FIG. 1, the substrate of the Schottky device 100 can include a contact layer 114 that can be formed from a metal, such as aluminum (Al) on a back or bottom side of the substrate (e.g., the semiconductor region 110 in FIG. 1).

As noted above, the Schottky device 100 can be implemented in a semiconductor substrate that includes the semiconductor region 110, where the semiconductor region 110 is of a first conductivity type (e.g., N-type in the Schottky device 100 of FIG. 1). The Schottky device 100 includes a trench 120 (or multiple trenches 120) that is/are disposed (formed, etched, etc.) in the semiconductor region 110. The trenches 120 define mesas 112 of the semiconductor region 110 that are adjacent to the trenches 120. In the Schottky device 100, the mesas 112 act as the N-type pillars of the charge-balance structure of the Schottky device 100. In some implementations of the Schottky device 100, the trenches 120 have a depth of D1 in the semiconductor region 110, while the recesses 150 have a depth of D2 in the semiconductor region 110, the depth D1 being greater than the depth D2. In some implementations, the depth D2 can be in a range of 5-15 microns (μm) and the depth D1 can be in a range of 50-100 μm. In implementations, a ratio of the depth D2 to the depth D1 can be approximately 1 to 3, 1 to 6, 1 to 10, 1 to 20, etc.

As shown in FIG. 1, for each trench 120, a semiconductor material 130 of a second conductivity type (P-type in the Schottky device 100) is disposed in, and recessed in, the trench 120, such that a recess 150 is defined in an upper portion of the trench 120. As shown in FIG. 1, the recess 150 has a first sidewall 150A, a second sidewall 150B, and a bottom surface 150C. In some implementations, such as the Schottky device 100, the sidewalls 150A and 150 of the recess 150 can be orthogonal (e.g., substantially orthogonal) with respect to the bottom surfaces 150C of the recesses 150.

In the Schottky device 100, an implant of the second conductivity type (the P+ implant 140) is disposed in an upper portion of the semiconductor material 130 along the bottom surface 150C of the recess 150, and disposed along at least respective lower portions of the sidewalls 150A and 150B of the recess 150. As noted above, the implant 140 increases a P+ contact area of the Schottky device 100 (e.g., a merged PiN Schottky diode), which can reduce $V_f$ of the diode as compared with prior approaches. The implant 140 can be a boron implant that has a doping concentration that is higher than a doping concentration of the semiconductor material 130. Described another way, the implant 140 (e.g., at least a portion of the implant 140) is disposed between the bottom surface 150C of the recess 150 and a top portion of a lighter doped region of the semiconductor material 130 (e.g., a top portion of the semiconductor material 130 of the second conductivity type). Also, as shown in FIG. 1, the implant 140 can be wider (laterally wider) than the trench 120 disposed below the implant 140.

In an implementation of the Schottky device 100, the semiconductor region 110 can have a N-type doping concentration between $1.0 \times 10^{14}$ atoms/cm$^3$ and $1.0 \times 10^{17}$ atoms/cm$^3$; the semiconductor material 130 of the second conductivity type can have a P-type doping concentration between $1.0 \times 10^{14}$ atoms/cm$^3$ and $1.0 \times 10^{17}$ atoms/cm$^3$, and the implant 140 can have a P-type doping concentration between $2.0 \times 10^{17}$ atoms/cm$^3$ and $1.0 \times 10^{20}$ atoms/cm$^3$. In some implementations, a ratio of the doping concentration of the implant 140 to the doping concentration of the semiconductor material 130 of the second conductivity type can be approximately 1 to 500, 1 to 1000, 1 to 2000, etc.

In implementations, such as the example shown in FIG. 1, a Schottky device (e.g., the Schottky device 100) can have a corresponding recess 150 for each of the plurality of trenches 120. Each recess 150 (and its adjacent mesas 112) can have like features (e.g., identical features, substantially identical features, etc.) disposed therein and/or thereon, such as the features described below. However, for purposes of clarity of illustration and discussion, each of these features is not referenced for each of the recesses 150 illustrated in FIG. 1. Accordingly, reference numbers associated with a given recess 150 and/or mesa 112 in FIG. 1 also apply to other recesses 150 and/or mesa 112 in FIG. 1.

For instance, as shown in FIG. 1, the Schottky device 100 includes a metal layer (e.g., a Schottky metal layer) 160 that is disposed on upper surfaces of the mesas 112, on the sidewalls 150A and 150B of the recesses 150, and on the bottom surfaces 150C of the recesses 150. The metal layer 160, as noted above, can be a Schottky metal layer that can include molybdenum, platinum, vanadium, titanium, etc. In the Schottky device 100, the metal layer 160 defines Schottky interfaces 180A between the upper surfaces of the mesas 112 and the metal layer 160, and Schottky interfaces 180B between upper portions of the sidewalls 150A and 150B of the recess 150 and the metal layer 160. Further in the Schottky device 100, the metal layer 160 defines Ohmic contact interfaces 190A between the bottom surfaces 150C of the recesses 150 and the metal layer 160, and Ohmic contact interfaces 190B and 190C between the respective lower portions of the sidewalls 150A and 150B of the recesses 150 and the metal layer 160. Depending on the implementation, the implants 140 can have shapes other than shown in FIG. 1 (and FIGS. 2 and 5), such as a more rectangular shape, for example. Further, in some implementations, the pillars of the superjunction charge-balance structure can be tapered. For instance, the P-pillars could be wider at their tops than that their bottoms, with the corresponding N-pillars being narrower at their tops than at their bottoms, or vice versa. Still further, the width of the Schottky interfaces can vary with respect the widths of the pillars.

The Schottky device 100 also includes a metal electrode layer 170. The metal electrode layer 170 is disposed on the Schottky metal layer 160 on the upper surfaces of the mesas 112, on the Schottky metal layer 160 on the sidewalls 150A and 150B of the recess, and on the Schottky metal layer 160 on the bottom surfaces 150C of the recesses 150. A low resistance conductive interface is defined between the metal electrode layer 170 and the (Schottky) metal layer 160. The metal electrode layer 170 can include a low resistance metal, such as aluminum. In some implementations (such as in the approach shown in FIG. 8, the Schottky metal layer (e.g., the metal layer 160) can include an uneven portion (e.g., have a textured surface, have an irregular surface, have a patterned surface, have a topographic pattern formed on its upper surface, etc.) which can increase an overall surface area of an associated (corresponding, etc.) Schottky interface.

Figure 2:
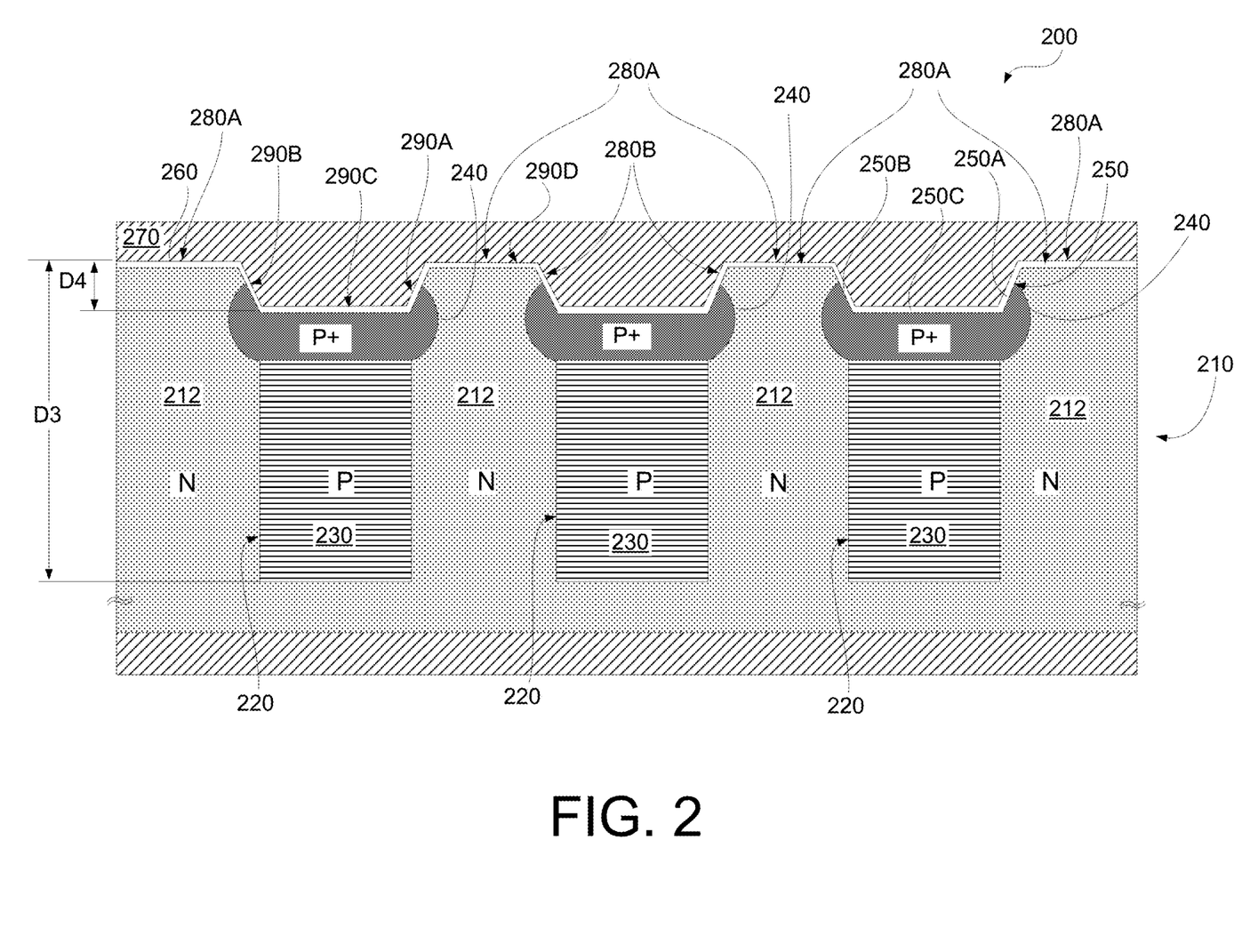
FIG. 2 is a diagram that illustrates a side cross-sectional view of a Schottky device including another merged PiN Schottky diode.

FIG. 2 is a diagram that illustrates a side cross-sectional view of another Schottky device 200 that includes a merged P-intrinsic-N (PiN) Schottky diode (e.g., which can be referred to as including a Schottky contact(s) or Schottky interface(s)). The Schottky device 200 includes a number of similar structural aspects as the Schottky device 100 of FIG. 1, and those aspects are similarly described with respect to FIG. 2. The Schottky device 200 also includes a number of structural aspects that are different than the Schottky device 100, and these differences are also described with respect to FIG. 2.

The Schottky device 200 of FIG. 2 includes Schottky interfaces 280A and 280B that are formed in a charge-balance structure (e.g., a superjunction charge-balance structure) that includes pillars of alternating (N and P) conductivity type, where the alternating pillars are formed in a semiconductor region 210 using, for example, the approaches described herein. The Schottky device 200 also includes a P-type (P+) implant 240 that increases a P+ contact area of the Schottky device 200, where the implant 240 is disposed in an upper portion of a recessed P-type pillar, and is also disposed in an adjacent portion of an N-type pillar (e.g., along a portion, such as lower portions, of sloped or tapered sidewalls of a recess above the P-type pillar 230, as is described in further detail below.

The implant 240, in combination with a recess 250 that is disposed above the P-type pillar, provides a P+ contact area in the Schottky device 200. This P+ contact reduces a forward voltage drop ($V_f$) of a merged PiN Schottky diode of the Schottky device 200, as compared to prior Schottky device implementations included in superjunction charge-balance structures.

In some implementations, while not specifically shown in FIG. 2, the semiconductor region 210 can be included in a substrate (e.g., a semiconductor substrate) having multiple layers with different doping concentrations. For instance, such a semiconductor substrate can include a first semiconductor layer that is heavily doped and a second semiconductor layer disposed on the first semiconductor layer, where the second semiconductor layer is lightly doped relative to the first semiconductor layer. The second semiconductor layer can be, for example a doped epitaxial layer that is grown on the first semiconductor layer. For example, the first semiconductor layer can be an N+ doped layer, while the second semiconductor layer is an N doped layer. As shown in FIG. 2, the substrate of the Schottky device 200 can include a contact layer 214 that can be formed from a metal, such as aluminum (Al) on a back or bottom side of the substrate (e.g., the semiconductor region 210 in FIG. 2).

As noted above, the Schottky device 200 can be implemented in a semiconductor substrate that includes the semiconductor region 210, where the semiconductor region 210 is of a first conductivity type (e.g., N-type in the Schottky device 200 of FIG. 2). The Schottky device 200 includes a trench 220 (or multiple trenches 220) that is/are disposed (formed, etched, etc.) in the semiconductor region 210. The trenches 220 define, at least in part, mesas 212 of the semiconductor region 210 that are adjacent to the trenches 220. In the Schottky device 200, the mesas 212 act as the N-type pillars of the charge-balance structure of the Schottky device 200. In some implementations of the Schottky device 200, the trenches 220 have a depth of D3 in the semiconductor region 210, while the recesses 250 have a depth of D4 in the semiconductor region 210, the depth D3 being greater than the depth D4. In some implementations, the depth D4 can be in a range of 5-15 microns (μm) and the depth D3 can be in a range of 50-100 μm. In implementations, a ratio of the depth D4 to the depth D3 can be approximately 1 to 3, 1 to 6, 1 to 10, 1 to 20, etc.

As shown in FIG. 2, for each trench 220, a semiconductor material 230 of a second conductivity type (P-type in the Schottky device 200) is disposed in, and recessed in, the trench 220, such that a recess 250 is defined in an upper portion of the trench 220. As shown in FIG. 2, the recess 250 has a first sloped or tapered sidewall 250A, a second sloped or tapered sidewall 250B, and a bottom surface 250C. In some implementations, such as the Schottky device 200, the sidewalls 250A and 250B of each recess 250 can each form an angle with respect to respective bottom surfaces 250C of the recesses 250, where that angle is greater than 90 degrees. In certain implementations, a given trench 220, and its corresponding recess 250, can be referred to as a trench 250 with a flared top (upper) portion, where the flared portion of the trench 220 is the recess 250 in the Schottky device 200.

In the Schottky device 200, an implant of the second conductivity type (the P+ implant 240) is disposed in an upper portion of the semiconductor material 230 along the bottom surface 250C of the recess 250, and disposed along lower portions of each of the sidewalls 250A and 250B of the recess 250. As noted above, the implant 240 increases a P+ contact area of the Schottky device 200 (e.g., a merged PiN Schottky diode), which can reduce $V_f$ of the diode as compared with prior approaches. The implant 240 can be a boron implant that has a doping concentration that is higher than a doping concentration of the semiconductor material 230. Described another way, the implant 240 (e.g., at least a portion of the implant 240) is disposed between the bottom surface 250C of the recess 250 and a top portion of a lighter doped region of the semiconductor material 230 (e.g., a top portion of the semiconductor material 230 of the second conductivity type). Also, as shown in FIG. 2, the implant 240, e.g., as a result of diffusion of the implant 240 due to thermal processing of the device 200, can be wider (laterally wider) than the trench 220 disposed below the implant 240.

In an implementation of the Schottky device 200, the semiconductor region 210 can have a N-type doping concentration between $1.0 \times 10^{14}$ atoms/cm$^3$ and $1.0 \times 10^{17}$ atoms/cm$^3$; the semiconductor material 230 of the second conductivity type can have a P-type doping concentration between $1.0 \times 10^{14}$ atoms/cm$^3$ and $1.0 \times 10^{17}$ atoms/cm$^3$, and the implant 240 can have a P-type doping concentration between $2.0 \times 10^{17}$ atoms/cm$^3$ and $1.0 \times 10^{20}$ atoms/cm$^3$. In some implementations, a ratio of the doping concentration of the implant 240 to the doping concentration of the semiconductor material 230 of the second conductivity type can be approximately 1 to 500, 1 to 1000, 1 to 2000, etc.

In implementations, such as the example shown in FIG. 2, a Schottky device (e.g., the Schottky device 200) can have a corresponding recess 250 for each of the plurality of trenches 220. Each recess 250 (and its adjacent mesas 112) can have like features (e.g., identical features, substantially identical features, etc.) disposed therein and/or thereon, such as the features described below. However, as with FIG. 1, for purposes of clarity of illustration and discussion, each of these features is not referenced for each of the recesses 250 illustrated in FIG. 2. Accordingly, reference numbers associated with a given recess 250 and/or mesa 212 in FIG. 2 also apply to other recesses 250 and/or mesas 212 in FIG. 2.

For instance, as shown in FIG. 2, the Schottky device 200 includes a metal layer (e.g., a Schottky metal layer) 260 that is disposed on upper surfaces of the mesas 212, on the sidewalls 250A and 250B of the recesses 250, and on the bottom surfaces 250C of the recesses 250. The metal layer 260, as noted above, can be a Schottky metal layer that can include molybdenum, platinum, vanadium, titanium, etc. In the Schottky device 200, the metal layer 260 defines Schottky interfaces 280A between upper surfaces of the mesas 212 and the metal layer 160. The Schottky metal layer 260 also defines Schottky interfaces 280B between upper portions of the sidewalls 250A and 250B (e.g., the portions of the sidewalls 250A and 250B not including the implant 240) of the recess 250 and the metal layer 260. Further in the Schottky device 200, the metal layer 260 defines Ohmic contact interfaces 290A, 290B and 290C between, respectively, lower portions of the sidewalls 250A, lower portions of the sidewalls 250B and the bottom surfaces 250C of the recesses 250 and the metal layer 160.

The Schottky device 200 also includes a metal electrode layer 270. The metal electrode layer is disposed on the Schottky metal layer 260 on the upper surfaces of the mesas 212, on the Schottky metal layer 260 on the sidewalls 250A and 250B of the recesses 250, and on the Schottky metal layer 260 on the bottom surfaces 250C of the recesses 250. A low resistance conductive interface is defined between the metal electrode layer 270 and the (Schottky) metal layer 260. The metal electrode layer 270 can include a low resistance metal, such as aluminum.

Describing the device 200 another way, the device 200 can include a substrate (the semiconductor region 210), a first pillar of a first conductivity type (the mesa 212), and a second pillar of a second conductivity type (the semiconductor layer 230 and the implant 240). The first pillar and the second pillar can be alternately disposed, as shown in FIG. 2. The device 200 can also include a metal layer 260 that has a first portion disposed on the first pillar (on the mesa 212) and a second portion disposed on the second pillar (on the bottom surface 250C of the recess 250. The first portion of the metal layer 260 can be wider (broader, have a greater surface area, etc.) than the second portion of the metal layer 260. The metal layer 260 can also include a third portion that is disposed between (e.g., is continuous with) the first portion of the metal layer 260 and the second portion of the metal layer 260.

As shown in FIG. 2, the third portion of the metal layer 260 (which can be disposed on the sidewall 250B or on the sidewall 250C of the recess 250) can be in contact with both the first pillar and the second pillar. Also in the device 200, the second pillar can have an upper portion (the implant 240) that has a first doping concentration and a lower portion (the semiconductor material 230) that has a second doping concentration, where the second doping concentration is lower than the first doping concentration, such as described herein. In the device 200, the metal layer 260 can be a Schottky metal layer.

Figure 3:
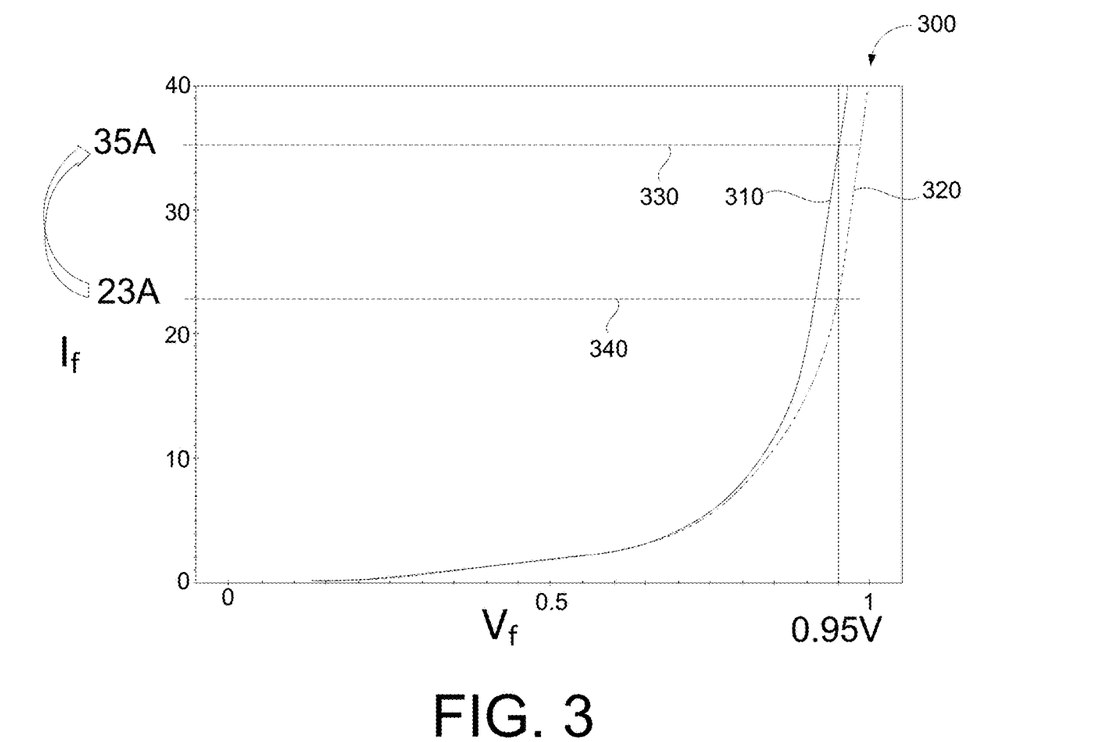
FIG. 3 is a diagram that illustrates a graph of simulation results comparing operation of an implementation of the merged PiN Schottky diode of FIG. 1 with operation of a current Schottky diode implementation.

FIG. 3 is a diagram that illustrates a graph 300 of simulation results comparing operation of an implementation of a merged PiN Schottky diode, such as the merged PiN Schottky diodes of the Schottky devices 100 and 200 of FIGS. 1 and 2 with operation of a current Schottky diode implementation, such a planar Schottky diode implemented in a superjunction charge balance structure without a recess, such as the recesses 150 or 250 and without an implant, such as the implants 140 or 240. Specifically, the graph 300 illustrates current-voltage (IV) characteristics of the merged PiN Schottky diodes described herein compared with the (IV) characteristics of current Schottky diode implementation, illustrating some performance advantages of the Schottky device implementations of FIGS. 1 and 2 over current implementations.

In the graph 300, the line 310 illustrates IV characteristics of the Schottky diode implementations described herein, while the line 320 illustrates the IV characteristics of a current, planar Schottky diode implementation. In the graph 300, the X-axis represents applied forward-bias voltage (forward voltage $V_f$) applied to the Schottky diodes illustrated by the lines 310 and 320 in FIG. 3. The Y-axis in the graph 300 represents forward-bias current (forward current $I_f$) of the Schottky diodes illustrated by the lines 310 and 320 in FIG. 3.

Further in FIG. 3, a line 330 illustrates an $I_f$ of approximately 35 amperes (A), which corresponds with an $I_f$ for the IV characteristics of the line 310 (e.g., for the Schottky diodes of FIGS. 1 and 2) at a $V_f$ of approximately 0.95 volts (V), as indicated on the X-axis in the graph 300. A line 340 in FIG. 3 illustrates an $I_f$ of approximately 23 A, which corresponds with an $I_f$ for the IV characteristics of the line 310 (e.g., for a current Schottky diode implementation) at the $V_f$ of approximately 0.95 V.

Accordingly, as shown by the IV characteristics of the line 310 and 320 in the graph 300, a current rating of the Schottky diode implementations described herein can be approximately 1.5 times that of prior Schottky diode implementations. Said another way, the Schottky diode implementations illustrated herein (e.g., in the Schottky devices 100 and 200) can support a given $I_f$ at a lower $V_f$ as compared to prior implementations. For instance, the Schottky diode implementations described herein can support an $I_f$ of approximately 23 A at a $V_f$ of approximately 0.9 V, as compared to a $V_f$ of 0.95 V for prior implementations. Similarly, the Schottky diode implementations described herein can support an $I_f$ of approximately 35 A at a $V_f$ of approximately 0.95 V, as compared to a $V_f$ of 1.0 V for prior implementations. These improved IV characteristics of the Schottky diode implementations described herein can provide a number of advantages. For instance, the improved IV characteristics can allow for a reduction of a semiconductor die used to implement such Schottky diodes as compared to current implementations. In some embodiments, a die size reduction of approximately 33% can be realized for a Schottky diode with a given current rating. Further the improved IV characteristics can result in improved efficiency (e.g., power efficiency) of systems, devices and circuits in which such Schottky diodes are included. Such application can include, industrial applications, such as welders, induction heating, uninterruptable power supplies (UPS), solar inverters, and electrical vehicle chargers, as some examples. Other applications for such Schottky diodes can include computing severs, telecommunication devices and motor control applications (e.g., pumps, air conditioners, fans and refrigerators).

Figure 4:
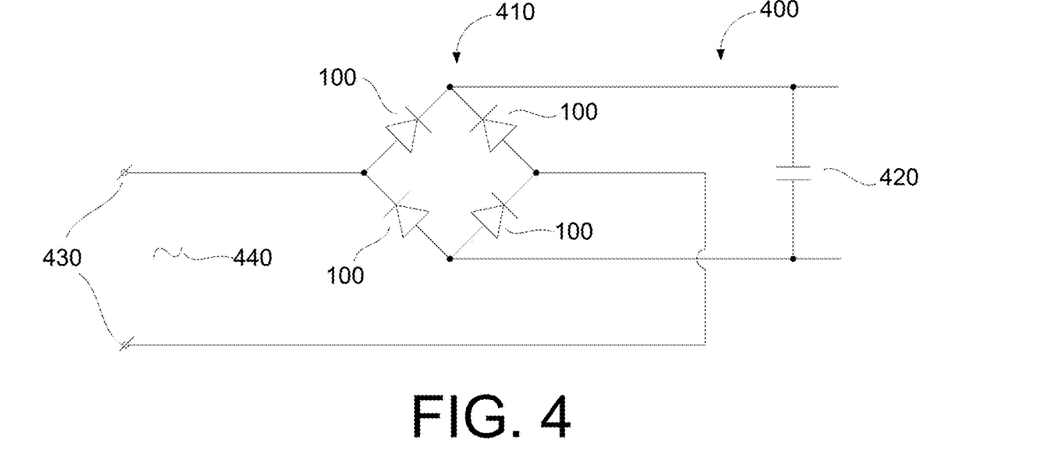
FIG. 4 is a schematic diagram illustrating a circuit that can include the merged PiN Schottky diode of FIG. 1 and/or the merged PiN Schottky diode of FIG. 2.

FIG. 4 is a schematic diagram illustrating a circuit 400 that can include the merged PiN Schottky diode of FIG. 1 and/or the merged PiN Schottky diode of FIG. 2. The circuit 400 is given by way of example and the merged PiN Schottky diodes of FIGS. 1 and 2 can be included in any number of other circuits, systems and/or devices. The circuit 400 is a diode bridge circuit that can be used, for example, in an inverter (rectifier) that is used to invert an alternating current (AC) signal to a direct current (AC) signal. The circuit 400 includes a diode block 410, a capacitor 420 and input terminals 430. The diode block can include a plurality of Schottky devices 100 (e.g., the Schottky devices 100 shown in FIG. 1). As noted above, in some implementations, one or more of the Schottky devices of the diode block 410 can be implemented using the Schottky device 200 of FIG. 2. In the circuit 400, an AC signal 440, applied to the input terminals is rectified (inverted) to a DC signal by the diode block 410 and the capacitor 420.

Figure 5A:
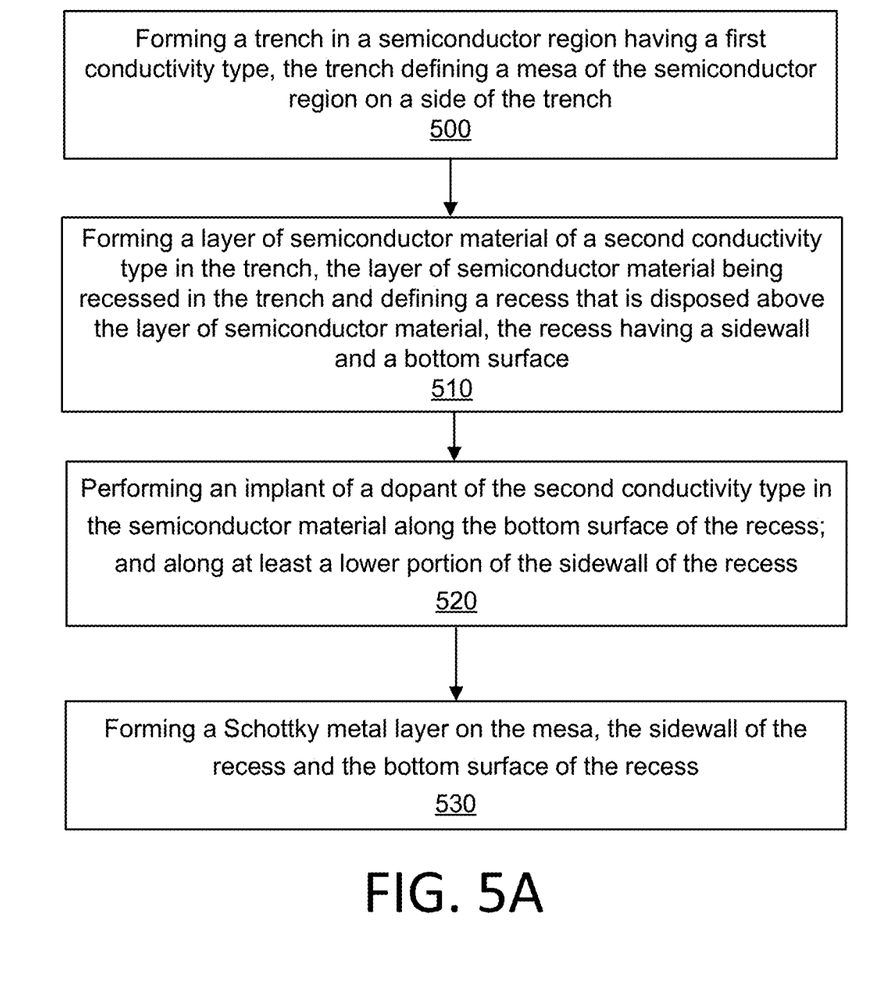
FIG. 5A is a flowchart illustrating a method (process flow) for forming the merged PiN Schottky diodes of FIGS. 1 and 2.

FIG. 5A is a flowchart illustrating a method (process flow) for forming the merged PiN Schottky diodes of FIGS. 1 and 2. For purposes of illustration, further reference is generally made to the elements of the Schottky device 100 in the following description of the process flow of FIG. 5A and the description of the process flow of FIG. 5B. It will be appreciated, however, that in some implementations, the process flows of FIGS. 5A and 5B can also be used to produce the Schottky device 200 of FIG. 2, such as indicated below.

At block 500, the process flow of FIG. 5A can include forming a trench 120 in a semiconductor region 110, where the semiconductor region 100 has a first conductivity type (e.g., N-type) The trench 120 can define a mesa (an N-type pillar) 112 of the semiconductor region 100 that is disposed adjacent to (to the side of) the trench 120.

At block 510, the process flow of FIG. 5A can include forming a layer of semiconductor material 130 of a second conductivity type (a P-type pillar) in the trench 120. The layer of semiconductor material 130 can be recessed in the trench 120, defining a recess 150 that is disposed above the layer of semiconductor material 130. As was described with respect to FIG. 1, the recess 150 can have a first sidewall 150A, a second sidewall 150B and a bottom surface 150C.

At block 520, the process flow of FIG. 5A can include performing (forming) an implant 140 of a dopant of the second conductivity type (P-type). As described herein, the implant 140 can have a doping concentration that is greater than a doping concentration of the semiconductor material 130 (e.g., the implant 140 can be P+ doped, while the layer of semiconductor material 130 can be P doped). As noted above, the implant 140 can also be described as being disposed below the bottom surface 150C of the recess 150 and above an upper surface of the layer of semiconductor material 130. For instance, as shown in FIG. 1, the implant 140 can be disposed in the layer of semiconductor material 130 along the bottom surface 150C of the recess 150 and along at least a lower portion of the sidewall 150A (and at least a lower portion of the sidewall 150B) of the recess 150. In the Schottky device 200 of FIG. 2, as was described above, the implant 140 can disposed along an entire length of the sidewalls 250A and 250B, as well as along a first portion of an upper surface of the mesa 212.

At block 530, the process flow of FIG. 5A can include forming a metal layer (e.g. a Schottky metal layer) on the upper surface of the mesa 112, the sidewall 150A (and the sidewall 150B) of the recess 150 and on the bottom surface 150C of the recess 150. As discussed above, for the Schottky device 100, a Schottky interface (a Schottky contact, Schottky diode, etc.) is formed between the metal layer 160 and the upper surface of the mesa 112 (e.g., the Schottky interface 180A), an upper portion of the sidewall 150A of the recess 150, and an upper portion of the sidewall 150B of the recess 150 (e.g., the Schottky interfaces on the sidewalls 150A and 150B being the Schottky interfaces 180B). Further in the Schottky device 100, an Ohmic contact is formed between the metal layer 160 and the lower portion of the sidewall 150A of the recess 150, the lower portion of the sidewall 150B of the recess 150, and the bottom surface 150C of the recess 150.

As also discussed above, for the Schottky device 200, a Schottky interface (a Schottky contact, a Schottky diode, etc.) is formed between the metal layer 160 and a second portion of an upper surface of the mesa 212 (e.g., the Schottky interface 280), where the second portion of the upper surface of the surface of the mesa 212 is adjacent to the first portion of the upper surface of the mesa 212 along which the implant 240 is disposed (and the second portion of the upper surface of the mesa 212 does not include the implant 240). Further in the Schottky device 200, an Ohmic contact is formed between the metal layer 260 and the sidewall 250A of the recess 250, the sidewall 250B of the recess 250, and the bottom surface 250C of the recess 250.

Figure 5B:
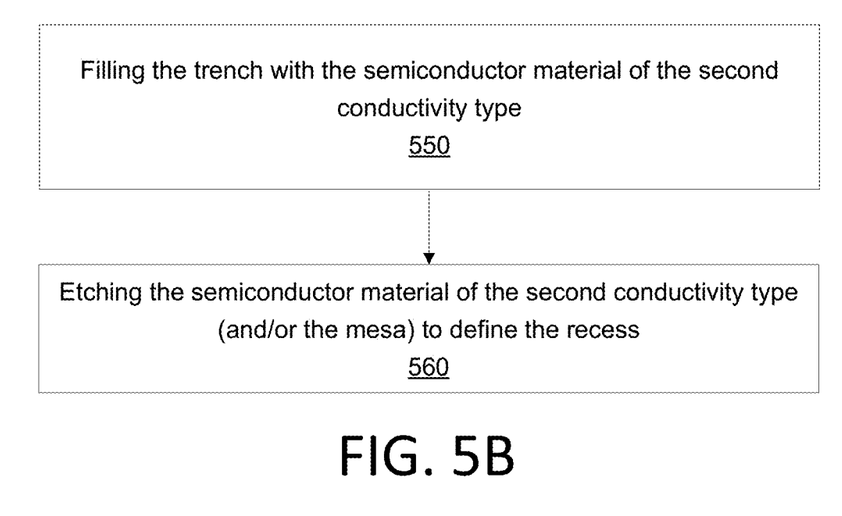
FIG. 5B is a flowchart illustrating a method (process flow) for defining a recess of the merged PiN Schottky diodes of FIGS. 1 and 2 that can be implemented in conjunction with the method of FIG. 5A.

FIG. 5B is a flowchart illustrating a method (process flow) for defining a recess of the merged PiN Schottky diodes of FIGS. 1 and 2 that can be implemented in conjunction with the method of FIG. 5A. In some implementations, the process flow of FIG. 5B can be implemented for block 510 of the process flow of FIG. 5A to form the layer of semiconductor material 130 of the second conductivity type in the trench 120 and to define the recess 150 for the Schottky device 100, or to form the layer of semiconductor material 230 of the second conductivity type in the trench 220 and to define the recess 250 for the Schottky device 200.

At block 550, the process flow of FIG. 5B can include filling (e.g., completely filling, substantially completely filling, etc.) the trench 120 or the trench 220 formed at block 500 of the process flow of with semiconductor material of the second conductivity type. At block 560, for the Schottky device 110, the process flow of FIG. 5B can include etching the semiconductor material of the second conductivity type used to fill the trench 120 to define the recess 150. For the Schottky device 200, the etching at block 560 can also include etching the mesa 212 (along with the semiconductor material of the second conductivity type used to fill the trench 220) to form a flared recess 250 with an angled sidewall 250A (and/or the angled sidewall 250B in a second mesa 212). As discussed above with respect to FIG. 2, the sidewalls 250A and/or 250B, after the etching at block 560, can define an angle with the bottom surface 250C of the recess 250, where the angle is greater than 90 degrees.

Figure 6:
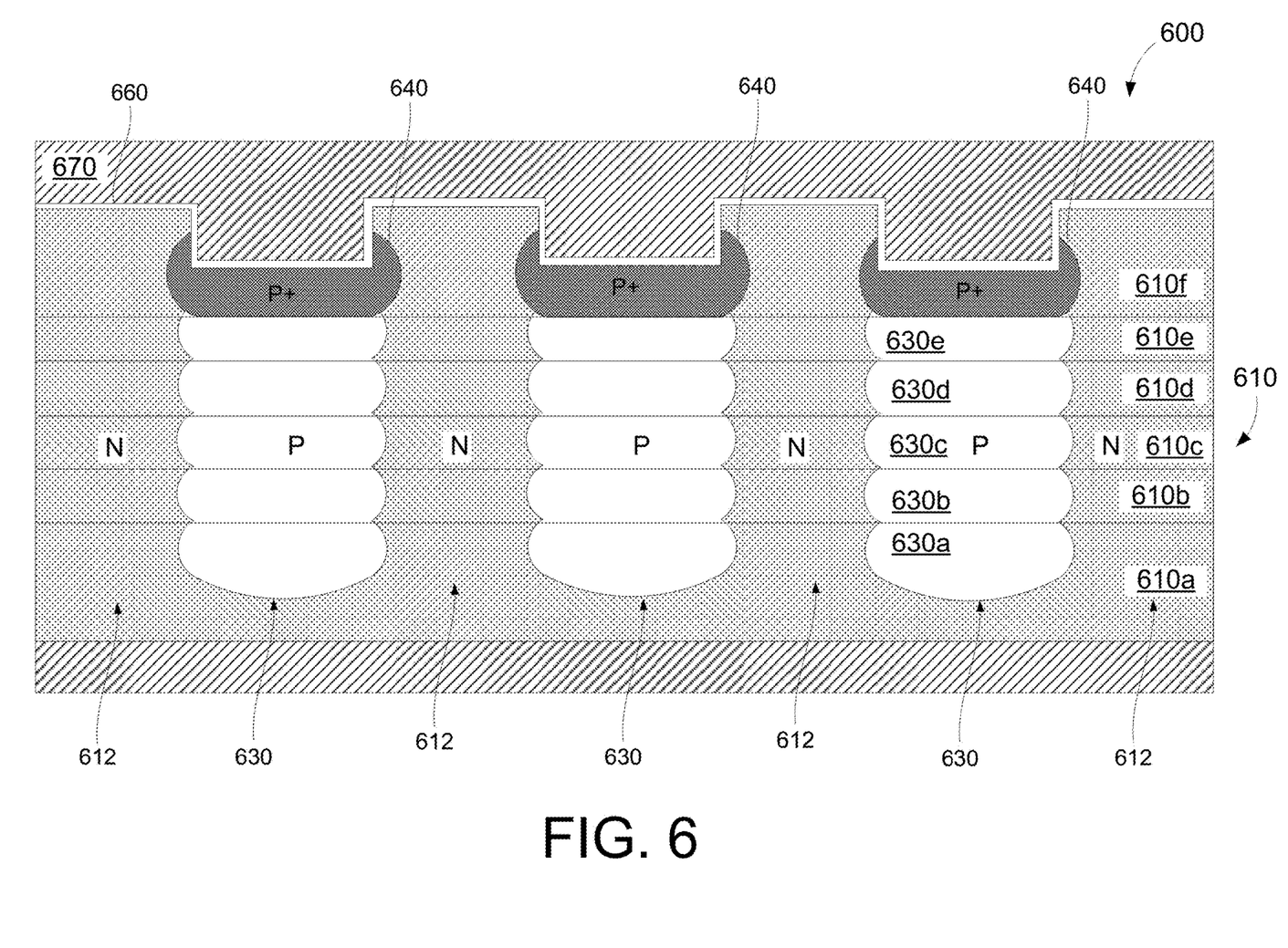
FIG. 6 is a diagram that illustrates a side cross-sectional view of a Schottky device including yet another merged PiN Schottky diode.

FIG. 6 is a diagram that illustrates a side cross-sectional view of another Schottky device 600 that includes a merged P-intrinsic-N (PiN) Schottky diode (e.g., which can be referred to as including a Schottky contact(s) or Schottky interface(s)). The Schottky device 600 includes a number of similar structural aspects as the Schottky device 100 of FIG. 1 and of the Schottky device 200 of FIG. 2. For instance, the structure of recesses, Schottky interfaces, Ohmic contact interfaces, P+ implants (640), P-pillar depths (D1 in FIG. 1 and D3 in FIG. 2) and recess depths (D2 in FIG. 1 and D4 in FIG. 2) in the device 600 are similar to those described above with respect to the devices 100 and 200. Accordingly, for purposes of brevity, those features will not be described again in detail with respect to the device 600. In implementations, the pillar structure of FIG. 6 can be implemented in the devices 100 and 200, or in other devices, as appropriate.

Further, the Schottky device 600, as compared to the devices 100 and 200, includes structural aspects that are different than the Schottky devices 100 and 200, such as the structure of (and processes for producing) pillars of alternating conductivity type (N-pillars 612 and P-pillars 630) of the superjunction charge balance structure of the device 600. These differences are described with respect to FIGS. 6 and 7.

In the device 600, each of the N-pillars 612, as well as each of the P-pillars 630 can have respective like features (e.g., identical features, substantially identical features, etc.) as other pillars of like conductivity type, such as described below. However, for purposes of clarity of illustration and discussion, each of these features is not referenced for each of the N-pillars 612 or the P-pillars 630 illustrated in FIG. 6. Accordingly, reference numbers associated with a given N-pillar 612 or P-pillar 630 in FIG. 6 also apply, respectively to other N-pillars 612 or P-pillars 630 in FIG. 6.

The Schottky device 600 of FIG. 6 can be implemented in a semiconductor substrate that includes the semiconductor region 610, where the semiconductor region 610 is of a first conductivity type (e.g., N-type in the Schottky device 100 of FIG. 1). As shown in FIG. 6, the semiconductor region 610 can include a plurality of layers (e.g., N-type epitaxial layers) 610a, 610b, 610c, 610d, 610e and 610f. In the device 600, after each epitaxial layer of the epitaxial layers 610a-610f is formed (grown, deposited, etc.), respective recesses (trenches, openings, etc.) corresponding with the P-pillars 630 can be formed and P-type semiconductor material can be disposed (grown, deposited, etc.) in those recesses. For example, as shown in FIG. 6, after forming the epitaxial layer 610a, recesses can be formed in which layers 630a of P-type semiconductor material (for each of the P-pillars 630) can be disposed.

After forming the layer 630a of P-type semiconductor material, in the device 600, the epitaxial layer 610b can be formed (grown, deposited, etc.) on the epitaxial layer 610a and the layer 630a of the P-pillars 630. After forming the epitaxial layer 610b, a second set of recesses can be formed in which layers 630b of P-type semiconductor material (for each of the P-pillars 630) can be disposed. This process can be repeated for epitaxial layer 610c-610f, layers 630c, 630d and 630e of P-type semiconductor material and implants 640 of the P-pillars 630. The implants 640 can be formed in a similar manner as layers 630a-630e, with the implants 640 including a layer of P-type semiconductor material having a doping concentration that is higher than a doping concentration of the layers 630a-630e. Accordingly, in the device 600, a P-pillar can include the layers 630a-630e and the implant 640. As shown in FIG. 6, the respective recesses, layers 630a-630e and implants 640 for each P-pillar 630 are vertically aligned (substantially vertically aligned, stacked, etc.) with each other, as to form the respective P-pillars 630.

In the Schottky device 600, the portions of the epitaxial layers 610a-610f that are disposed between the P-pillars 630 act as the N-type pillars of the charge-balance structure of the Schottky device 600. In the Schottky device 600, the P+ implants 640, which are each disposed in upper portions of respective P-pillars 630, increase a P+ contact area of the Schottky device 600 (e.g., a merged PiN Schottky diode), which can reduce $V_f$ of the diode as compared with prior approaches. The implants 640 can be a boron implant that has a doping concentration that is higher than a doping concentration of the P-type semiconductor material of the layers 630a-630e.

In an implementation of the Schottky device 600, the epitaxial layers 610a-610f of the semiconductor region 610 can each have a N-type doping concentration between $1.0 \times 10^{14}$ atoms/cm$^3$ and $1.0 \times 10^{17}$ atoms/cm$^3$; where the doping concentration can be the same for each of the epitaxial layers 610a-610f, or can vary from layer to layer (e.g., to create a graded-doping concentration in the N-pillars 612). The P-type semiconductor material layers 630a-630e can have a doping concentration between $1.0 \times 10^{14}$ atoms/cm$^3$ and $1.0 \times 10^{17}$ atoms/cm$^3$, where the doping concentration can be the same for each of the layers 630a-630e, or can vary from layer to layer (e.g., to create a graded-doping concentration in the P-pillars 630). In the device 600, the implants 640 (in the upper portions of the P-pillars 630) can have a P-type doping concentration between $2.0 \times 10^{17}$ atoms/cm$^3$ and $1.0 \times 10^{20}$ atoms/cm$^3$. In some implementations, a ratio of the doping concentration of the implants 640 to the doping concentration of the P-type semiconductor material layers 630a-630e can be approximately 1 to 500, 1 to 1000, 1 to 2000, etc. By varying doping concentration in each epitaxial layer 610-610f and layers 630a-6302, capacitance of the charge balance structure can be varied.

Figure 7:
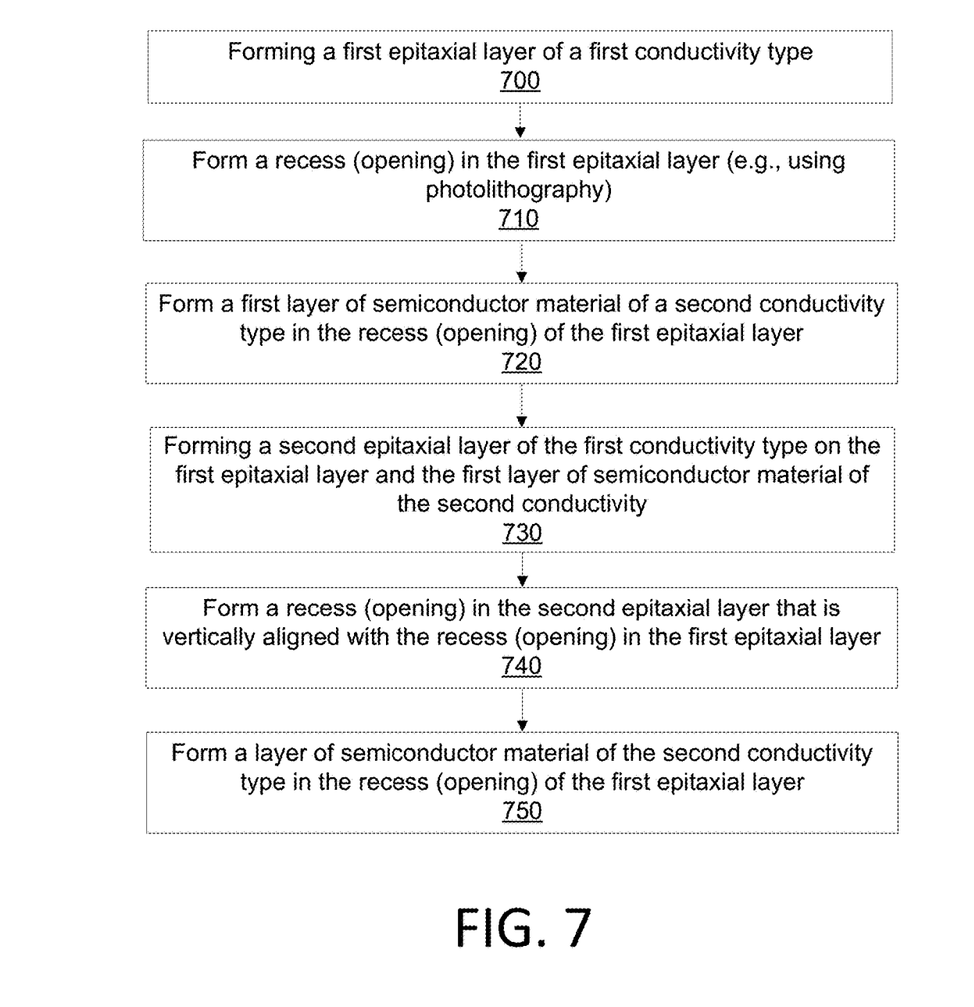
FIG. 7 is a flowchart illustrating a method (process flow) for forming the charge balance pillars of Schottky device of FIG. 6.

FIG. 7 is a flowchart illustrating a method (process flow) for forming the charge balance pillars of Schottky device 600 of FIG. 6. In FIG. 7, the method illustrates, for example, formation of the epitaxial layers 610a and 610b, as well as corresponding semiconductor material layers 630a and 630b. In implementations, the operations of FIG. 7 (e.g., blocks 730-750) can be repeated to form additional epitaxial layers (e.g., epitaxial layers 610c-610f), as well as well as additional P-type layers (layers 630c-630e and implant 640) of the P-pillar 630.

In FIG. 7, with further reference to FIG. 6, the method includes, at block 700, forming a first epitaxial layer 610a of a first conductivity type (N-type). At block 710, the method includes forming a recess (e.g. for receiving the bottom layer 630a of the P-pillar 630) in the first epitaxial layer 610a. The recess of block 710 can be formed using photolithography processes (including etching). At block 720, the method of FIG. 7 includes forming a first layer 630a of semiconductor material of a second conductivity type (P-type) in the recess (opening) of the first epitaxial layer 610b.

At block 730, the method of FIG. 7 includes forming a second epitaxial layer 610b of a first conductivity type (N-type) on the first epitaxial layer 610a and the first layer 630a of P-type semiconductor material. At block 740, the method includes forming a recess (e.g. for receiving the layer 630b of the P-pillar 630) in the second epitaxial layer 610b. As noted above, the recess of block 740 can be vertically aligned with the recess of block 710, such that the layers 630a and 630b define the first two layers of the P-pillar 630. As with the recess of block 710, the recess of block 740 can be formed using photolithography processes (including etching).

At block 750, the method of FIG. 7 includes forming a second layer 630b of P-type semiconductor material (a second layer of the pillar 630) in the recess (opening) of the second epitaxial layer 610b. As noted above, additional epitaxial layers (610c-610f), additional recesses, and additional P-type layers (630c-630e and implant 640) can be formed as described in, e.g., blocks 730-750 of FIG. 7 to produce the charge balance pillars of the device 600 illustrated in FIG. 6.

In other implementations, the Schottky device 600 shown in FIG. 6 can be produced using different process flows other than the process flow described above with respect to FIG. 7. For example, after forming the epitaxial layer 610 of the device 600, a P-type impurity such as boron (B) can be implanted in a predetermined dose into a portion of the first epitaxial layer 610a. As a result, an implant for the pillar layer 630a can be formed in at least an upper portion of the first epitaxial layer 610a. Subsequently, a second epitaxial layer 610b can be formed on the first epitaxial layer 610a in which the implant for the pillar layer 630a is disposed. The second epitaxial layer 610b may be formed by performing a same process as was used to form the first epitaxial layer 610a. After forming the second epitaxial layer 610b, a P-type impurity such as B may be implanted in a predetermined dose into a portion of the second epitaxial layer 610b by performing a second ion implantation process. Accordingly, an implant for the second pillar layer 630b can be formed in at least an upper portion of the second epitaxial layer 610b.

Repeating the above process, for the example device 600, three additional times, a structure can be obtained (as shown in FIG. 6) that includes first to fifth epitaxial layers 610a-610e, and respective implants for the first to fifth pillar layers 630a-630e. A sixth epitaxial layer 610f can also be formed on the fifth epitaxial layer 610e. A P-type impurity such as B can be implanted in a predetermined dose into a portion of the sixth epitaxial layer 610f, by performing a sixth ion implantation process (e.g., after first to fifth implantation processes used to form the first to fifth pillar layers 630a-630F). Accordingly, an implant for a sixth pillar layer (P+ implant 640) can be formed in at least an upper portion of a recess in the sixth epitaxial layer 610f. In some implementations, a concentration of the P-type impurity of the implant 640 is higher than the concentration of the P-type impurity of the implants for the pillar layer 630a-630e.

After forming the epitaxial layers 610a-610f, the implants for the pillar layers 630a-630e and the implant 640, an annealing process may be performed on the device 600. This annealing process can cause diffusion of impurities of the implants pillar layers (e.g., 630a-630e and 640). For example, the impurities may be diffused by a predetermined distance in the horizontal direction and/or the vertical direction through the annealing process, and accordingly, implants of the first to sixth pillar layers (e.g., 630a-630e and 640) are connected to each other along the vertical direction, to form P-pillars 630 extending in vertical direction.

Figure 8:
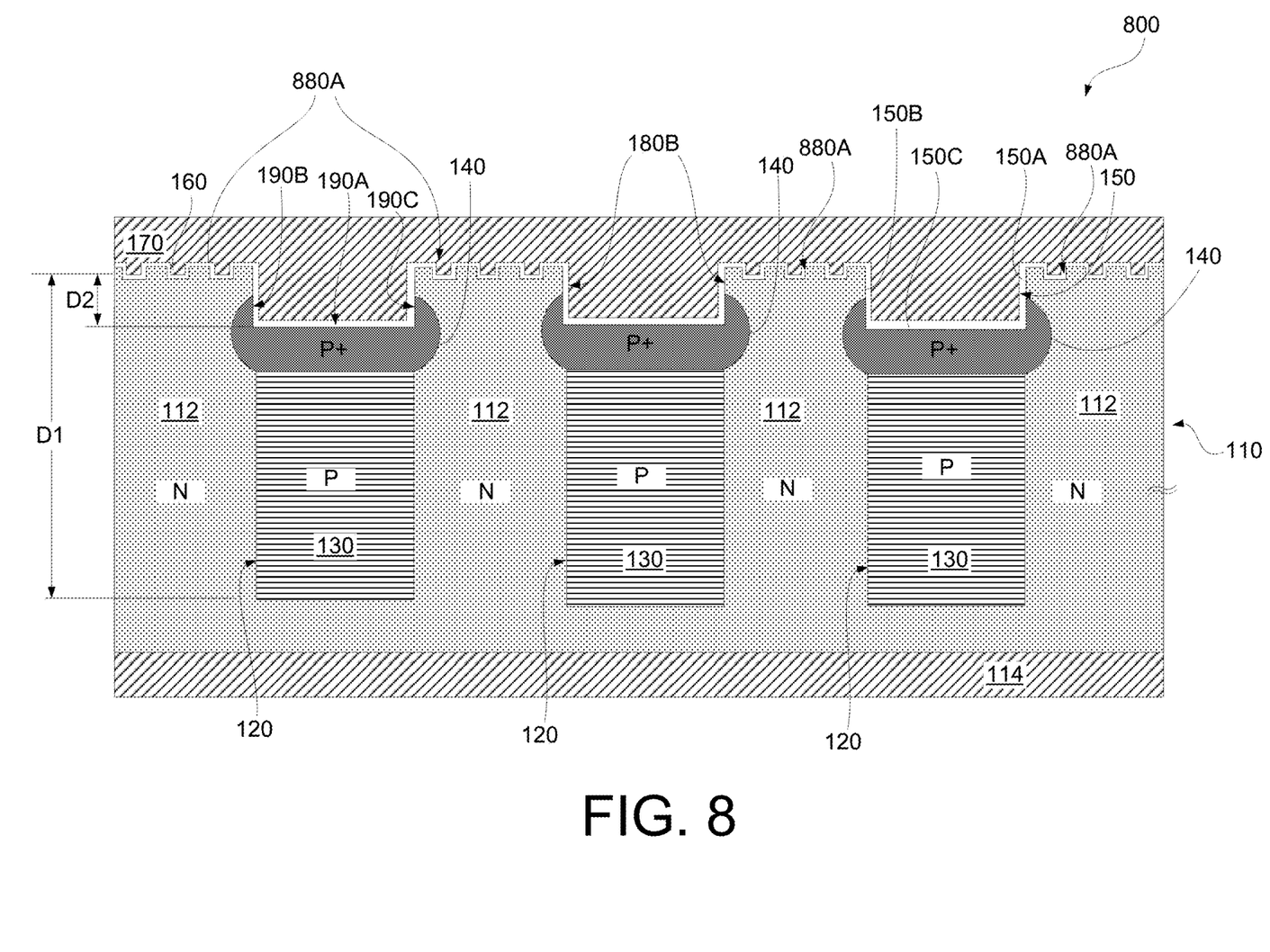
FIG. 8 is a diagram that illustrates a side cross-sectional view of a Schottky device including another merged PiN Schottky diode.

FIG. 8 is a diagram that illustrates a side cross-sectional view of another Schottky device 800 that includes a merged P-intrinsic-N (PiN) Schottky diode (e.g., which can be referred to as including a Schottky contact(s) or Schottky interface(s)). The Schottky device 800 includes a number of similar (or same) structural aspects as the Schottky device 100 of FIG. 1, which are referenced with the same reference characters as in FIG. 1. The Schottky device 800 also includes structural aspects that are different than the Schottky device 100, and these differences are also described below with respect to FIG. 8. It will be appreciated that the aspects of FIG. 8 described below can be implemented in other Schottky devices, such as the Schottky devices 200 and 600 described above, as well as other Schottky device implementations.

The Schottky device 800 of FIG. 8 includes Schottky interfaces 880A that are formed on upper surfaces of the N-pillars 112. As shown in FIG. 8, portions of the Schottky metal layer 160 and the upper surfaces of the N-pillars 112 (e.g., at an upper surface of the semiconductor region 110) that form the Schottky interfaces 880A have upper surfaces that are textured (uneven, irregular, topographically patterned, etc.). That is, recesses can be formed on an upper surface of mesas of the semiconductor region 110 (e.g., upper surfaces of the N-pillars 112) and the portion of the metal layer 160 forming the Schottky interfaces 880A can be formed (e.g., conformally formed) on the mesas and recesses (e.g., formed on the textured upper surfaces of the N-pillars 112).

Such textured surfaces on the upper surfaces of the N-pillars 112 (e.g., the upper surface of mesas of the semiconductor region 110) and the portion of the metal layer 160 that is used to form the Schottky interfaces 880A can result in an increased area of an associated Schottky interface, such as compared to a Schottky device without such a textured surface. The recesses of the Schottky interfaces 880A can have a depth that is shallow as compared to a depth of the recesses 150 associated with the P-pillars (e.g., the recesses formed above the semiconductor material 130). For instance, a bottom surface of the recesses of the textured surface formed (defined, etc.) in the upper surface of N-pillars 112 can be vertically above the bottom surface 150C of the recesses 150 (e.g., as shown in FIG. 8). In some implementations, a first portion of the N-pillars 112 can have a textured surface for the Schottky interfaces 880A, while a second portion of the N-pillars 112 for the Schottky interfaces can have a planar (substantially planar) surface, such as the Schottky interfaces 180A illustrated in FIG. 1. Also, in some implementations, the recesses of textured surfaces formed on (defined on) the upper surfaces of the N-pillars 112 can be non-uniform. For instance, a textured upper surface of an N-pillar 112 can have recesses of varying widths and/or varying depths.

The textured surface of the Schottky interfaces 880A of FIG. 8 can be formed (defined, etc.) using, for example, photolithography and etching (e.g., dry-etching using $Cl_2$, HBr or $SF_6$ gases). For instance, photolithography can be used to define an etch mask for defining the recesses in one or more upper surfaces of the N-pillars 112 and etching can be performed (using the etch mask) to define the recesses. After forming the recesses in the upper surface(s) of the N-pillars 112, the metal layer 160 can be formed to define the Schottky interfaces (e.g., textured Schottky interfaces) 880A. Depending on the particular implementation, the recesses of the Schottky interfaces 880A can be formed before, after, or concurrently with the recesses 130 associated with the P-pillars (e.g., above the semiconductor material 130).

In a first example, a device can include a substrate; a first pillar of a first conductivity type; a second pillar of a second conductivity type, the first pillar and the second pillar being alternately disposed; and a metal layer having a first portion disposed on the first pillar and a second portion disposed on the second pillar. The first portion of the metal layer can be wider than the second portion of the metal layer.

In a second example based on the first example, the metal layer can includes a third portion that is disposed between the first portion of the metal layer and the second portion of the metal layer. The third portion of the metal layer can be in contact with the first pillar and the second pillar.

In a third example based on any one of the first or second examples, the first portion of the metal layer can have a textured upper surface having an uneven portion.

In a fourth example based on any one of the first through third examples, the second pillar can have an upper portion having a first doping concentration and a lower portion having a second doping concentration. The second doping concentration can be lower than the first doping concentration.

In a fifth example based on any one of the first through fifth examples, the metal layer can be a Schottky metal layer.

In a sixth example, a device can include a semiconductor substrate of a first conductivity type. The semiconductor substrate can include a semiconductor region of the first conductivity type. The device can also include a trench disposed in the semiconductor region. The trench can define a mesa of the semiconductor region on a side of the trench. The device can further include a semiconductor material of a second conductivity type disposed in and recessed in the trench to define a recess. The recess can have a sidewall and a bottom surface. The device can also further include an implant of the second conductivity type disposed in an upper portion of the semiconductor material along the bottom surface of the recess and along at least a lower portion of the sidewall of the recess. The implant can have a doping concentration that is higher than a doping concentration of the semiconductor material of the second conductivity type.

The device can also further include a metal layer disposed on an upper surface of the mesa, on the sidewall of the recess, and on the bottom surface of the recess.

In a seventh example based on the sixth example, the metal layer can define a Schottky interface between the upper surface of the mesa and the metal layer, and an upper portion of the sidewall of the recess and the metal layer.

In an eighth example based on any one of the sixth or seventh examples, the metal layer can define an Ohmic contact between the lower portion of the sidewall of the recess and the metal layer, and between the bottom surface of the recess and the metal layer.

In a ninth example based on any one of the sixth through eighth examples, the trench can have a depth in the semiconductor region in a range of 50-100 microns (μm) and the recess can have a depth in the semiconductor region in a range of 5-15 μm.

In a tenth example based on any one of the sixth through ninth examples, the mesa can be a first mesa, the side of the trench can be a first side, and the sidewall can be a first sidewall. The trench can define a second mesa of the semiconductor region on a second side of the trench. The recess can have a second sidewall, and the metal layer can be further disposed on the second sidewall and the second mesa. The metal layer can define a Schottky interface between at least an upper portion of the second sidewall and the metal layer; and between the second mesa and the metal layer.

In an eleventh example based on any one of the sixth through tenth examples, the sidewall of the recess can be substantially orthogonal with respect to the bottom surface of the recess.

In a twelfth example based on any one of the sixth through tenth examples, the sidewall of the recess and the bottom surface of the recess can define an angle greater than 90 degrees.

In a thirteenth example based on any one of the sixth through twelfth examples, the first conductivity type can be N-type and the second conductivity type can be P-type.

In a fourteenth example based on any one of the sixth through thirteenth examples, the implant can be a boron implant.

In a fifteenth example based on any one of the sixth through fourteenth examples, the semiconductor substrate can have a doping concentration between $1.0 \times 10^{14}$ atoms/cm$^3$ and $1.0 \times 10^{17}$ atoms/cm$^3$, the semiconductor material of the second conductivity type can have a doping concentration between $1.0 \times 10^{14}$ atoms/cm$^3$ and $1.0 \times 10^{17}$ atoms/cm$^3$, and the implant can have a doping concentration between $2.0 \times 10^{17}$ atoms/cm$^3$ and $1.0 \times 10^{20}$ atoms/cm$^3$.

In a sixteenth example, a device can include a semiconductor region of a first conductivity type and a trench disposed in the semiconductor region. The trench can define a mesa of the semiconductor region on a side of the trench. The device can also include a semiconductor material of a second conductivity type disposed in the trench and a recess disposed above the semiconductor material in the trench. The recess can have a sidewall and a bottom surface, the sidewall being defined by the mesa. The device can further include an implant of the second conductivity type disposed between the bottom surface of the recess and above a top surface of the semiconductor material of the second conductivity type. The implant can have a doping concentration that is higher than a doping concentration of the semiconductor material. The device can also further include a Schottky metal layer disposed on an upper surface of the mesa, on the sidewall of the recess, and on the bottom surface of the recess.

In a seventeenth example based on the sixteenth example, the Schottky metal layer can define a Schottky interface between: the upper surface of the mesa and the Schottky metal layer, and at least an upper portion of the sidewall of the recess and the Schottky metal layer.

In an eighteenth example based on any one of the sixteenth or seventeenth examples, the Schottky metal layer can define an Ohmic contact with: a lower portion of the sidewall of the recess, and the bottom surface of the recess.

In a nineteenth example, based on any one of the sixteenth through eighteenth examples, the implant can be disposed along at least a lower portion of the sidewall of the recess.

In a twentieth example, based on any one of the sixteenth through nineteenth examples, the device can include a metal electrode layer disposed on: the Schottky metal layer on the upper surface of the mesa, on the Schottky metal layer on the sidewall of the recess, and on the Schottky metal layer on the bottom surface of the recess.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some implementations may be implemented sing various types of semiconductor processing techniques associated with semiconductor substrates including, but not limited to, for example, Silicon (Si), Silicon Carbide (SiC), Galium Arsenide (GaAs), Galium Nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A method comprising:
    forming, in a semiconductor substrate:
        a first pillar of a first conductivity type; and
        a second pillar of a second conductivity type, the first pillar and the second pillar being alternately disposed, the second pillar being in direct contact with the first pillar;
    forming an implant of the second conductivity type in an upper portion of the second pillar, the implant having a doping concentration that is higher than a doping concentration of a lower portion of the second pillar;
    forming a textured pattern on an upper surface of the first pillar; and
    forming a Schottky metal layer having:
        a first portion directly and conformally disposed on the textured pattern on the upper surface of the first pillar; and
        a second portion directly disposed on the implant along an upper surface of the second pillar,
        the first portion of the Schottky metal layer being wider than the second portion of the Schottky metal layer.

2. The method of claim 1, wherein forming the Schottky metal layer includes forming a third portion of the Schottky metal layer that is disposed between the first portion of the Schottky metal layer and the second portion of the Schottky metal layer, the third portion of the Schottky metal layer being in contact with the first pillar and the second pillar.

3. A method comprising:
    forming, in a semiconductor region of a first conductivity type, a charge balance structure, the forming the charge balance structure including:
        forming a trench disposed in the semiconductor region, the trench defining a mesa of the semiconductor region on a side of the trench;
        disposing a semiconductor material of a second conductivity type in the trench, the semiconductor material being recessed in the trench, so as to define a recess, the recess having a sidewall and a bottom surface, the semiconductor material of the second conductivity type being in direct contact with the semiconductor region;
        forming an implant of the second conductivity type disposed in an upper portion of the semiconductor material along the bottom surface of the recess and along at least a lower portion of the sidewall of the recess, the implant having a doping concentration that is higher than a doping concentration of the semiconductor material of the second conductivity type; and
    forming a metal layer that is:
        directly disposed on an upper surface of the mesa;
        directly disposed on the implant along the sidewall of the recess, and
        directly disposed on the implant along the bottom surface of the recess.

4. The method of claim 3, wherein forming the metal layer includes defining a Schottky interface:
    between the upper surface of the mesa and the metal layer; and
    between an upper portion of the sidewall of the recess and the metal layer.

5. The method of claim 3, wherein forming the metal layer includes defining an Ohmic contact:
    between the lower portion of the sidewall of the recess and the metal layer; and
    between the bottom surface of the recess and the metal layer.

6. The method of claim 3, wherein the trench has a depth in the semiconductor region in a range of 50-100 microns (μm) and the recess has a depth in the semiconductor region in a range of 5-15 μm.

7. The method of claim 3, wherein the mesa is a first mesa, the side of the trench is a first side, the sidewall is a first sidewall, the trench defines a second mesa of the semiconductor region on a second side of the trench, the recess has a second sidewall, and the metal layer is further disposed on the second sidewall and the second mesa,
    the forming the metal layer further including defining a Schottky interface between:
        at least an upper portion of the second sidewall and the metal layer; and
        the second mesa and the metal layer.

8. The method of claim 3, wherein the sidewall of the recess is substantially orthogonal with respect to the bottom surface of the recess.

9. The method of claim 3, wherein the sidewall of the recess and the bottom surface of the recess define an angle, the angle being greater than 90 degrees.

10. The method of claim 3, wherein the first conductivity type is N-type and the second conductivity type is P-type.

11. The method of claim 3, wherein the implant is a boron implant.

12. The method of claim 3, wherein the semiconductor region is disposed on a semiconductor substrate of a first conductivity type,
    the semiconductor substrate having a doping concentration between $1.0 \times 10^{14}$ atoms/cm$^3$ and $1.0 \times 10^{17}$ atoms/cm$^3$;
    the semiconductor material of the second conductivity type having a doping concentration between $1.0 \times 10^{14}$ atoms/cm$^3$ and $1.0 \times 10^{17}$ atoms/cm$^3$; and
    the implant having a doping concentration between $2.0 \times 10^{17}$ atoms/cm$^3$ and $1.0 \times 10^{20}$ atoms/cm$^3$.

13. A method comprising:
    forming, in a semiconductor region of a first conductivity type, a charge balance structure, the forming the charge balance structure including:

forming a trench, the trench defining a mesa of the semiconductor region on a side of the trench;

disposing a semiconductor material of a second conductivity type in the trench, the semiconductor material being in direct contact with the semiconductor region, the semiconductor material being recessed in the trench, so as to define a recess above the semiconductor material in the trench, the recess having a sidewall and a bottom surface, the sidewall being defined by the mesa;

forming an implant of the second conductivity type between the bottom surface of the recess and above a top surface of the semiconductor material, the implant having a doping concentration that is higher than a doping concentration of the semiconductor material; and forming a Schottky metal layer:
  directly on an upper surface of the mesa;
  directly on the implant along the sidewall of the recess; and
  directly on the implant along the bottom surface of the recess.

14. The method of claim 13, wherein the forming the Schottky metal layer includes defining a Schottky interface between:
  the upper surface of the mesa and the Schottky metal layer; and
  at least an upper portion of the sidewall of the recess and the Schottky metal layer.

15. The method of claim 14, wherein the forming the Schottky metal layer includes defining an Ohmic contact with:
  a lower portion of the sidewall of the recess; and
  the bottom surface of the recess.

16. The method of claim 13, wherein a portion of the implant is disposed along at least a lower portion of the sidewall of the recess.

17. The method of claim 13, further comprising forming a metal electrode layer on:
  the Schottky metal layer on the upper surface of the mesa;
  on the Schottky metal layer on the sidewall of the recess; and
  on the Schottky metal layer on the bottom surface of the recess.

* * * * *